United States Patent
Lin et al.

(10) Patent No.: US 9,306,037 B2
(45) Date of Patent: Apr. 5, 2016

(54) DUMMY GATE ELECTRODE OF SEMICONDUCTOR DEVICE

(71) Applicant: Taiwan Semiconductor Manufacturing Company, Ltd., Hsin-Chu (TW)

(72) Inventors: Jr-Jung Lin, Hsin-Chu (TW); Chih-Han Lin, Hsin-Chu (TW); Ming-Ching Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/456,797

(22) Filed: Aug. 11, 2014

(65) Prior Publication Data

US 2014/0349473 A1  Nov. 27, 2014

Related U.S. Application Data

(62) Division of application No. 13/538,734, filed on Jun. 29, 2012, now Pat. No. 8,803,241.

(51) Int. Cl.
| | |
|---|---|
| *H01L 21/336* | (2006.01) |
| *H01L 29/66* | (2006.01) |
| *H01L 21/306* | (2006.01) |
| *H01L 29/423* | (2006.01) |
| *H01L 21/8234* | (2006.01) |

(52) U.S. Cl.
CPC .... *H01L 29/66795* (2013.01); *H01L 21/30604* (2013.01); *H01L 29/42372* (2013.01); *H01L 29/6681* (2013.01); *H01L 29/66545* (2013.01); *H01L 21/823431* (2013.01)

(58) Field of Classification Search
CPC .............. H01L 21/823431; H01L 27/0886; H01L 21/823821; H01L 27/10826; H01L 21/845; H01L 29/41791

USPC .......... 257/288, 368, 369; 438/151, 197, 199
See application file for complete search history.

(56) References Cited

U.S. PATENT DOCUMENTS

| | | | |
|---|---|---|---|
| 2008/0111194 A1* | 5/2008 | Kawakita | H01L 29/7851 257/365 |
| 2009/0134454 A1 | 5/2009 | Takeuchi et al. | |
| 2009/0242995 A1 | 10/2009 | Suzuki et al. | |
| 2010/0301421 A1* | 12/2010 | Kronholz | H01L 21/28088 257/369 |
| 2011/0059584 A1* | 3/2011 | Takeuchi | H01L 21/84 438/231 |

(Continued)

FOREIGN PATENT DOCUMENTS

KR     100838398     6/2008

OTHER PUBLICATIONS

Korean Office Action and English Translation, Patent Application No. 10-2012-0130914, Oct. 29, 2013, 7 pages.

*Primary Examiner* — Jarrett Stark
*Assistant Examiner* — Shahed Ahmed
(74) *Attorney, Agent, or Firm* — Slater & Matsil, L.L.P.

(57) ABSTRACT

The disclosure relates to a dummy gate electrode of a semiconductor device. An embodiment comprises a substrate comprising a first surface; an insulation region covering a portion of the first surface, wherein the top of the insulation region defines a second surface; and a dummy gate electrode over the second surface, wherein the dummy gate electrode comprises a bottom and a base broader than the bottom, wherein a ratio of a width of the bottom to a width of the base is from about 0.5 to about 0.9.

20 Claims, 11 Drawing Sheets

(56) References Cited

U.S. PATENT DOCUMENTS

| | | |
|---|---|---|
| 2011/0147812 A1 | 6/2011 | Steigerwald et al. |
| 2011/0186932 A1* | 8/2011 | Mizumura ...... H01L 21/823431 257/368 |
| 2012/0007184 A1* | 1/2012 | Lee ................... H01L 29/42376 257/366 |
| 2012/0292715 A1* | 11/2012 | Hong .................... H01L 21/845 257/392 |
| 2013/0059435 A1* | 3/2013 | Yang ................. H01L 29/66545 438/589 |
| 2013/0153997 A1* | 6/2013 | Chang .................... B82Y 10/00 257/334 |
| 2013/0187237 A1* | 7/2013 | Yu ................... H01L 21/823807 257/369 |
| 2013/0270639 A1* | 10/2013 | Lee ................... H01L 29/41791 257/347 |

* cited by examiner

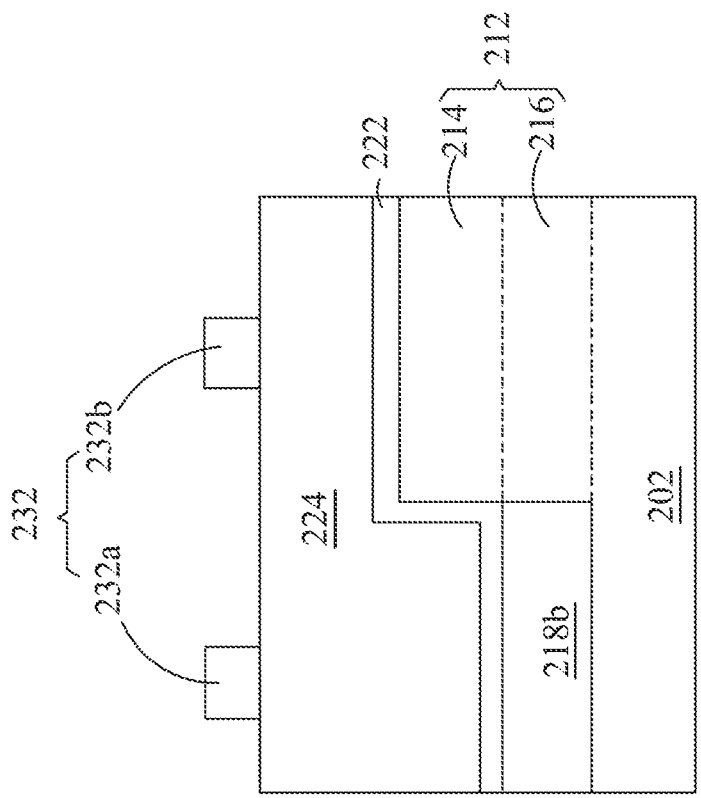
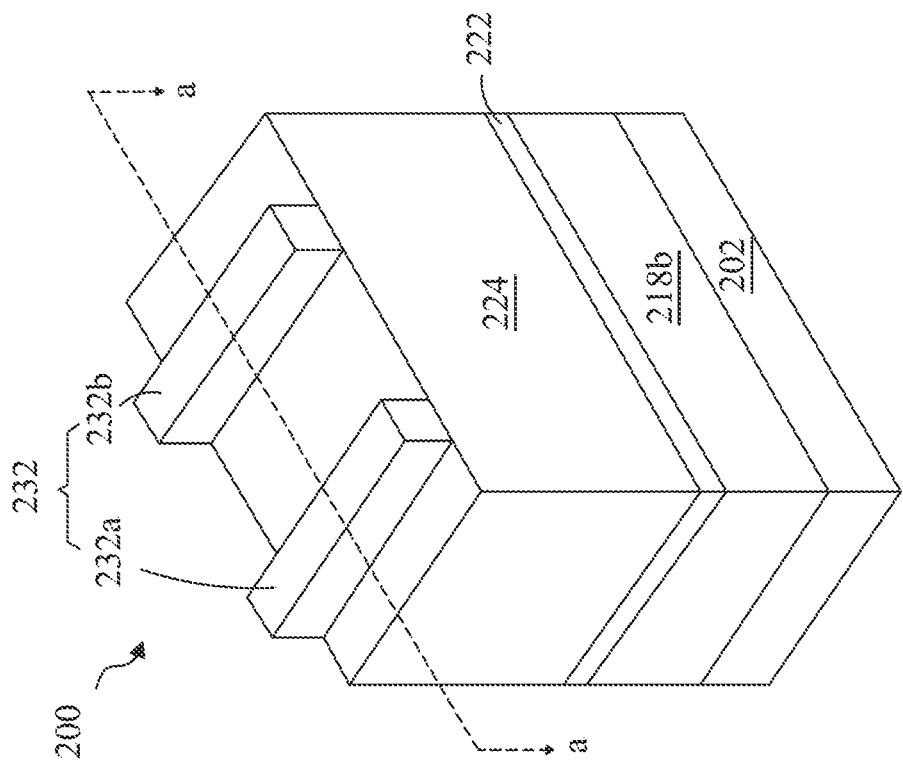
Fig. 8B
Fig. 8A

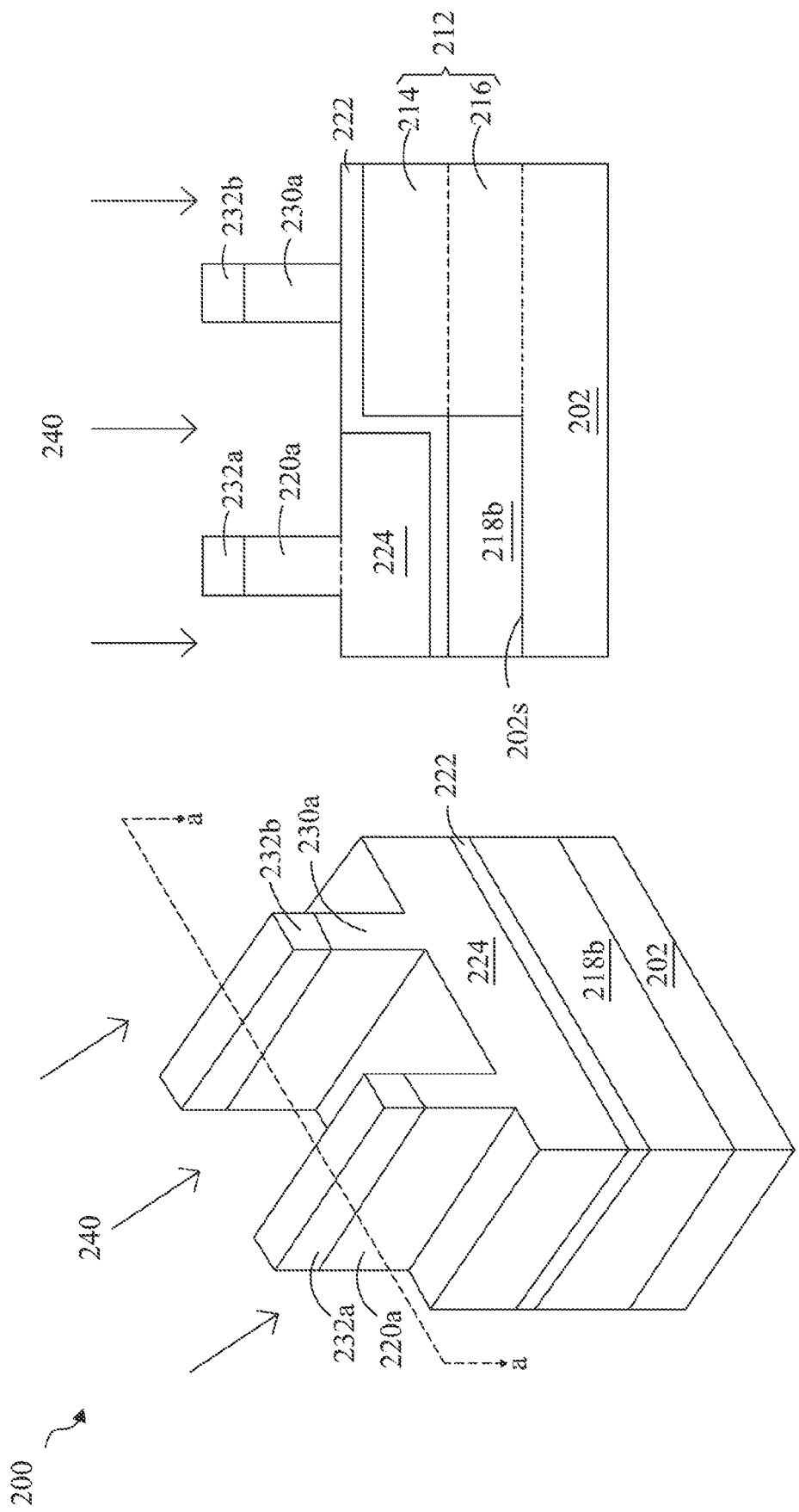

DUMMY GATE ELECTRODE OF SEMICONDUCTOR DEVICE

This application is a divisional application of, and claims priority to, U.S. patent application Ser. No. 13/538,734, entitled "Dummy Gate Electrode of Semiconductor Device," filed on Jun. 29, 2012, which application is incorporated herein by reference.

FIELD

The disclosure relates to integrated circuit fabrication, and more particularly to a semiconductor device with a dummy gate electrode.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in recessed source/drain (S/D) portions of the FinFET utilizing selectively grown silicon germanium may be used to enhance carrier mobility.

However, there are challenges to implement such features and processes in complementary metal-oxide-semiconductor (CMOS) fabrication. As the spacing between vertical fins decreases, these problems are exacerbated. For example, etching a dummy gate electrode may generate unwanted residues between fin edge and the dummy gate electrode, thereby increasing the likelihood of device instability and/or device failure.

BRIEF DESCRIPTION OF THE DRAWINGS

The present disclosure is best understood from the following detailed description when read with the accompanying figures. The various features illustrated in the drawings are not necessarily drawn to scale and are used for illustration purposes only. In fact, the dimensions of the various features may be arbitrarily increased or reduced for clarity of discussion.

FIGS. 3A-10B are perspective and cross-sectional views of a semiconductor device comprising a dummy gate electrode at various stages of fabrication according to various embodiments of the present disclosure;

DETAILED DESCRIPTION OF ILLUSTRATIVE EMBODIMENTS

Figure 1:
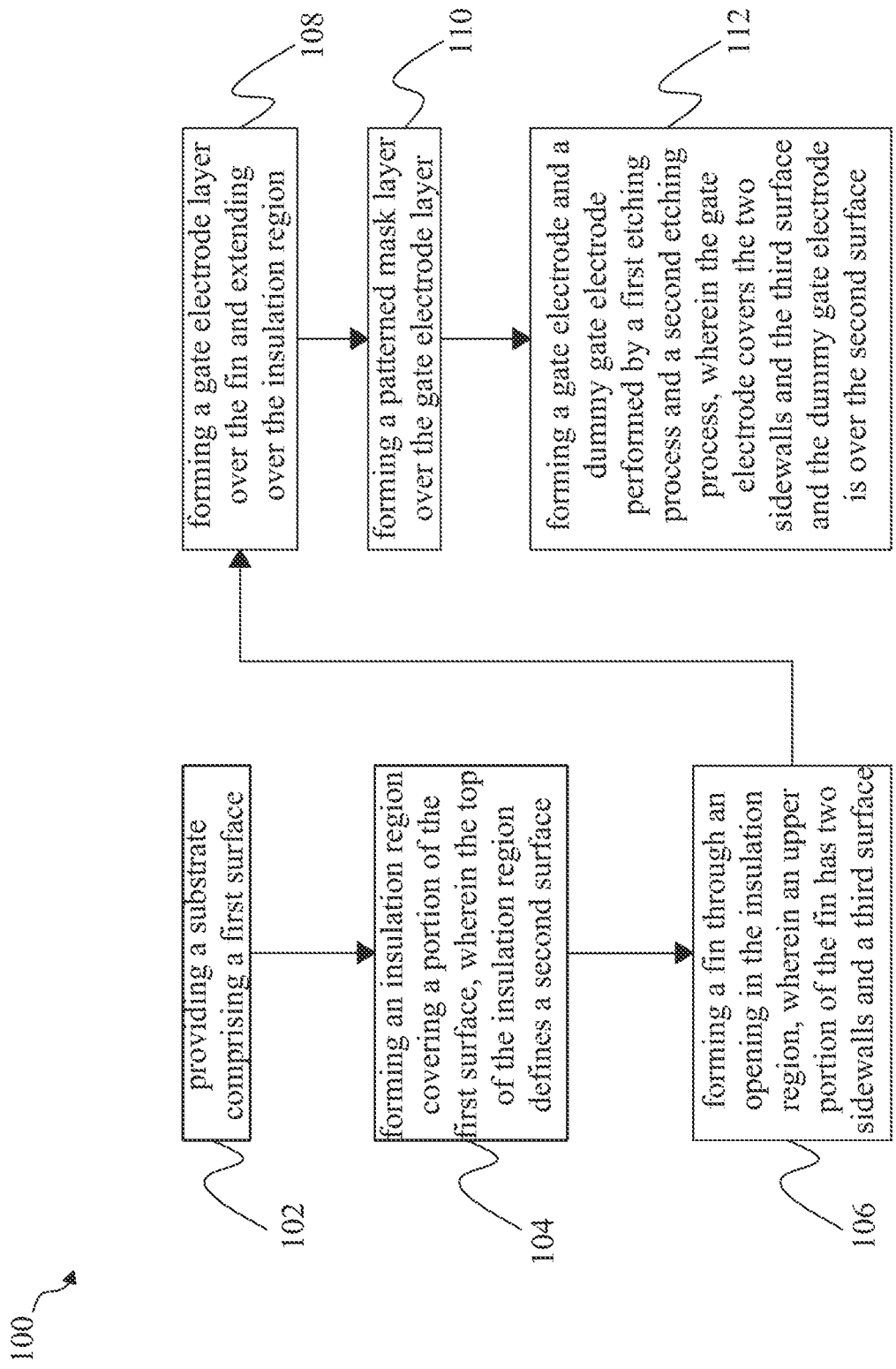
FIG. 1 is a flowchart illustrating a method of fabricating a dummy gate electrode of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a dummy gate electrode of a semiconductor device according to various aspects of the present disclosure. The method 100 begins with step 102 in which a substrate comprising a first surface is provided. The method 100 continues with step 104 in which an insulation region covering a portion of the first surface is formed, wherein a top of the insulation region defines a second surface. The method 100 continues with step 106 in which a fin through an opening in the insulation region is formed, wherein an upper portion of the fin has two sidewalls and a third surface. The method 100 continues with step 108 in which a gate electrode layer is formed over the fin and extending over the insulation region. The method 100 continues with step 110 in which a patterned mask layer is formed over the gate electrode layer. The method 100 continues with step 112 in which a gate electrode and a dummy gate electrode are formed performed by a first etching process and a second etching process, wherein the gate electrode covers the two sidewalls and the third surface and the dummy gate electrode is over the second surface. The discussion that follows illustrates embodiments of semiconductor devices that can be fabricated according to the method 100 of FIG. 1.

Figure 2:
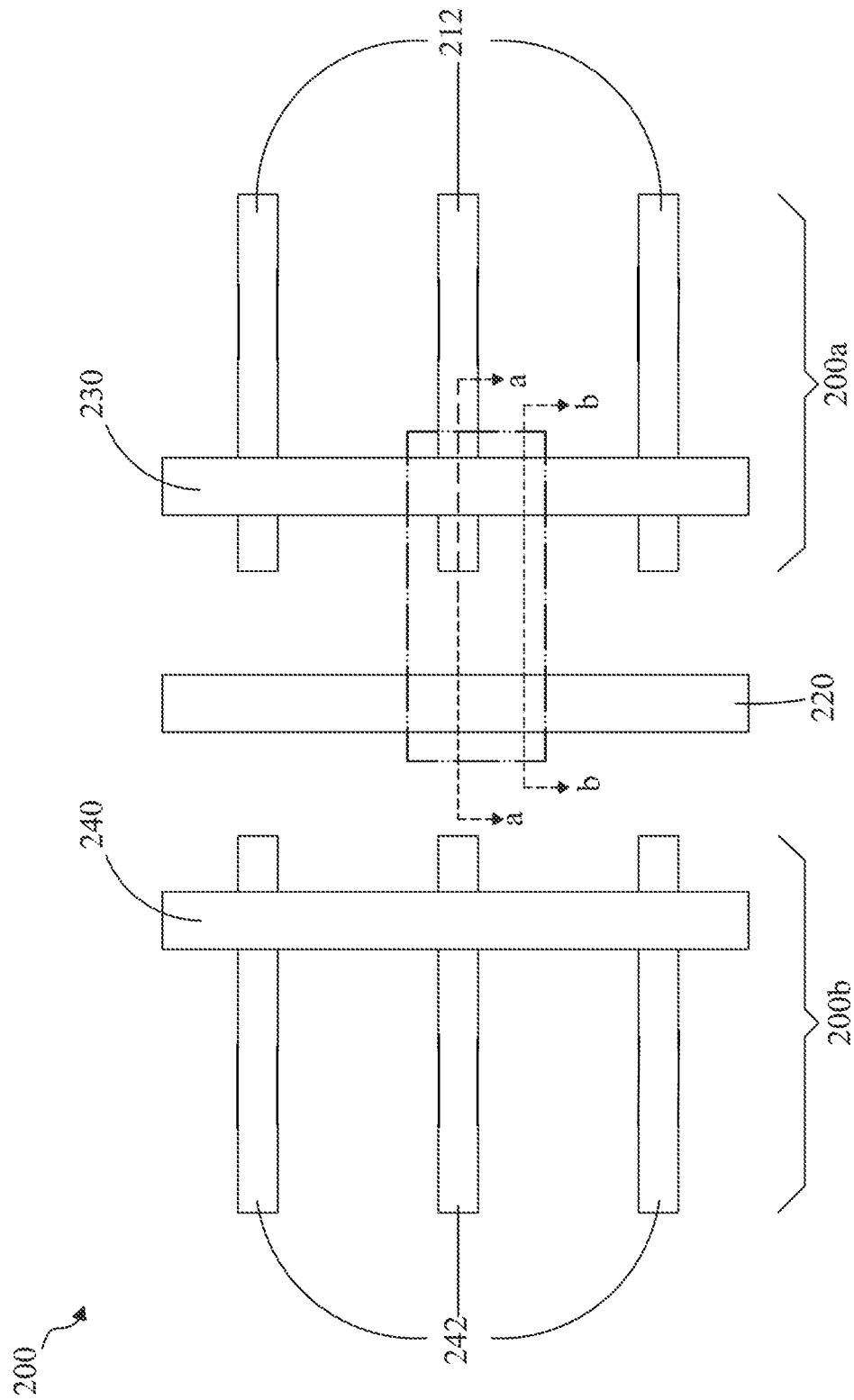
FIG. 2 shows a top view of a semiconductor device comprising a dummy gate electrode according to various aspects of the present disclosure.

FIG. 2 shows a top view of a semiconductor device 200 comprising a dummy gate electrode 220 according to various aspects of the present disclosure; and FIGS. 3A-10B are perspective and cross-sectional views of a semiconductor device 200 comprising a dummy gate electrode 220 at various stages of fabrication according to various embodiments of the present disclosure. Embodiments such as those described herein relate to a fin field effect transistor (FinFET), e.g., a fin-based, multi-gate transistor. The semiconductor device 200 may be included, for example, in a microprocessor, memory cell, and/or other integrated circuit (IC). It is noted that, in some embodiments, the performance of the operations mentioned in FIG. 1 does not produce a completed semiconductor device 200. A completed semiconductor device 200 may be fabricated using, for example, complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 10B are simplified for a better understanding of the concepts of the present disclosure. For example, although the figures illustrate the semiconductor device 200, it is understood an integrated circuit (IC) may comprise a number of other devices comprising resistors, capacitors, inductors, fuses, etc.

FIG. 2 illustrates a semiconductor device 200 fabricated using the steps in FIG. 1. The semiconductor device 200 comprises a first FinFET 200a on the right, a second FinFET 200b on the left, and a dummy gate electrode 220 between the first FinFET 200a and the second FinFET 200b. For illustration, the first FinFET 200a comprises three fins 212 and a gate electrode 230 traversing over the three fins 212, while the second FinFET 200b comprises three fins 242 and a gate electrode 240 traversing over the three fins 242. In some embodiments, each of the first FinFET 200a and the second FinFET 200b may comprise less than or greater than three fins, for example, one fin or five fins. For simplicity, only a portion of one fin 212, a portion of the gate electrode 230, and a portion of the dummy gate electrode 220 in the dotted area taken along the line a-a of FIG. 2 are illustrated in FIGS. 3A-10B.

Figure 3B:
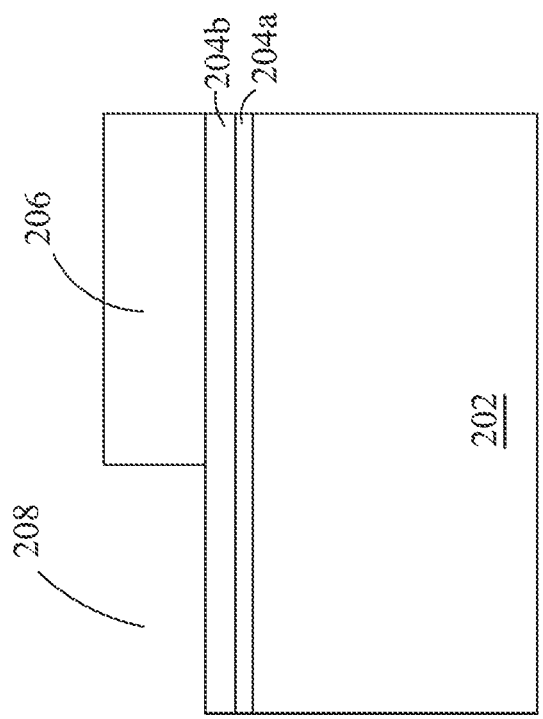
Figure 3A:
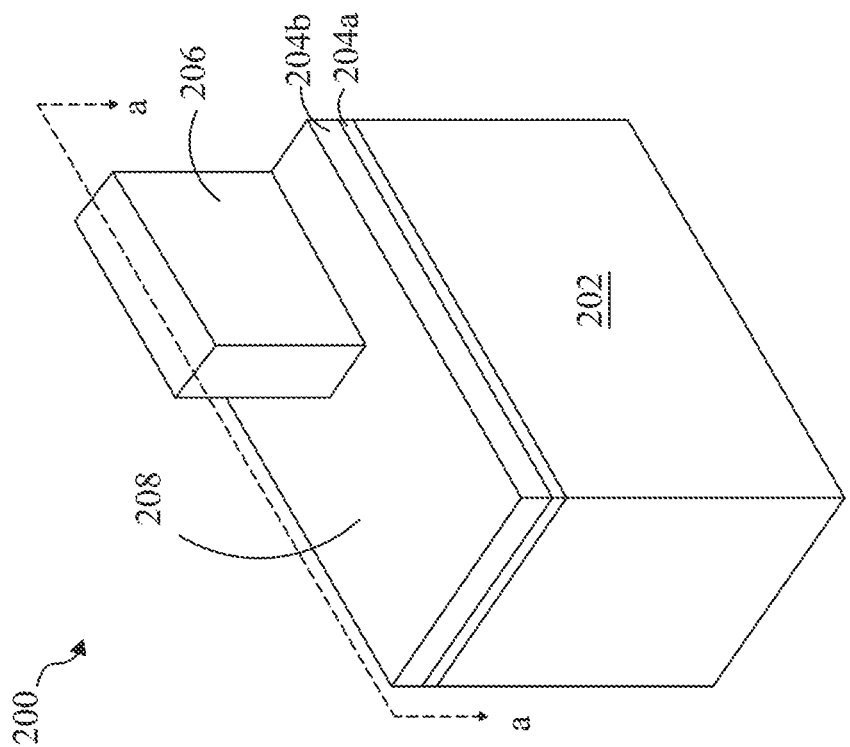

Referring to FIGS. 3A and 3B, and step 102 in FIG. 1, a substrate 202 is provided. FIG. 3A is a perspective view of the semiconductor device 200 having a substrate 202 at one of the various stages of fabrication according to an embodiment, and FIG. 3B is a cross-sectional view of a semiconductor device 200 taken along the line a-a of FIG. 3A. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epilayer), may be strained for performance enhancement, and/or may include a silicon-on-insulator (SOI) structure.

The fins are formed by etching into the substrate 202. In the depicted embodiment, one fin is shown for clarity. In practice, several fins may be formed simultaneously. In one embodiment, a pad layer 204a and a mask layer 204b are formed on the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In at least one embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A patterned mask, such as a photo-sensitive layer 206, is formed on the mask layer 204b and is then patterned, forming openings 208 in the photo-sensitive layer 206.

Figures 4A, 4B:
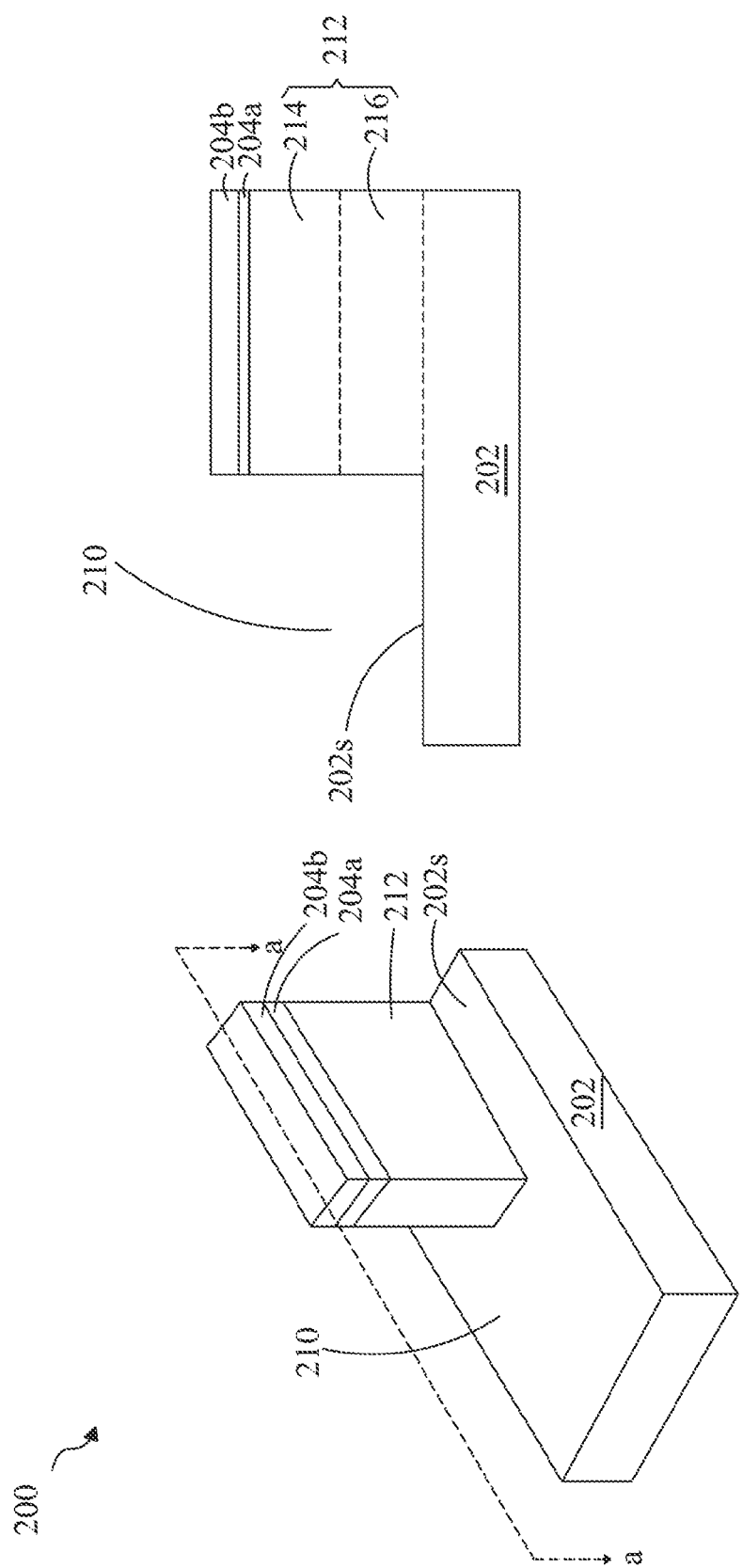

After formation of the openings 208 in the photo-sensitive layer 206, the structure in FIGS. 4A and 4B is produced by forming a fin 212 in the substrate 202. FIG. 4A is a perspective view of the semiconductor device 200 at one of the various stages of fabrication according to an embodiment, and FIG. 4B is a cross-sectional view of the semiconductor device 200 taken along the line a-a of FIG. 4A.

The mask layer 204b and pad layer 204a are etched through openings 208 to expose underlying semiconductor substrate 202. The exposed semiconductor substrate 202 is then etched to form trenches 210 with a first surface 202s of the semiconductor substrate 202. A portion of the semiconductor substrate 202 between trenches 210 forms semiconductor fin 212. In the depicted embodiment, the semiconductor fin 212 comprises an upper portion 214 and a lower portion 216 (separated by the dashed line for illustrative purposes). In the depicted embodiment, the upper portion 214 and the lower portion 216 comprise the same material, such as silicon.

Trenches 210 may be strips (viewed from in the top of the semiconductor device 200) parallel to each other, and closely spaced with respect to each other. Trenches 210 each has a width, a depth, and is spaced apart from adjacent trenches by a space. For example, the spacing between trenches 210 may be smaller than about 30 nm. In an alternative embodiment, trenches 210 may be continuous and surrounding the semiconductor fin 212 (shown in FIG. 2). The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence may improve the performance of the resulting integrated circuit.

Figure 5B:
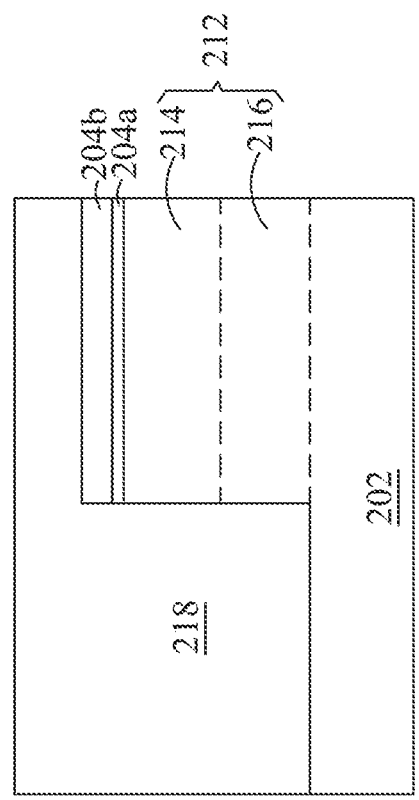
Figure 5A:
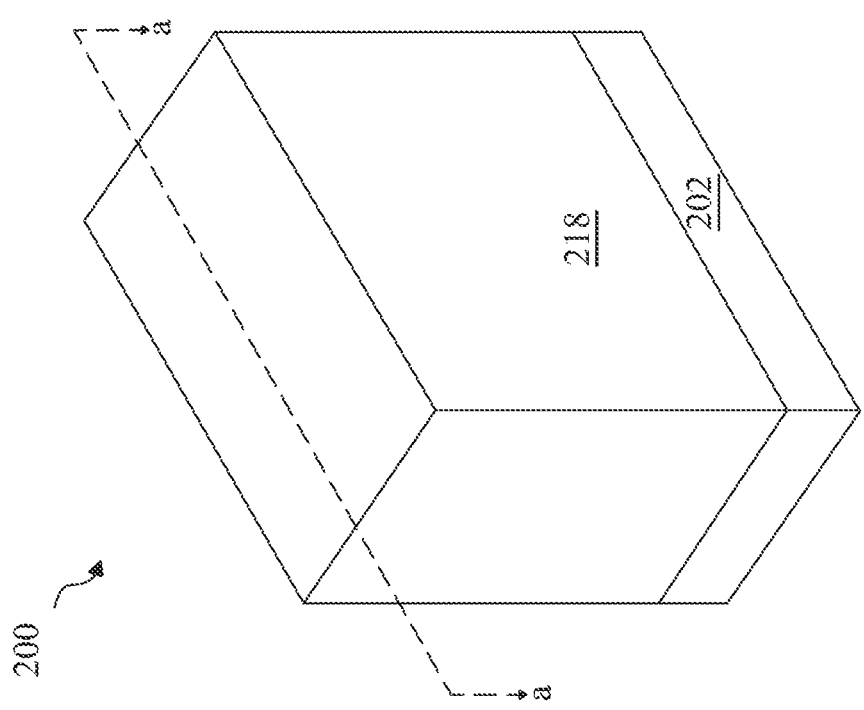

As depicted in FIGS. 5A and 5B, and step 104 in FIG. 1, subsequent to formation of the trenches 210 with the first surface 202s of the semiconductor substrate 202, the structure in FIGS. 5A and 5B is produced by forming an insulation region covering a portion of the first surface 202s. FIG. 5A is a perspective view of the semiconductor device 200 at one of the various stages of fabrication according to an embodiment, and FIG. 5B is a cross-sectional view of the semiconductor device 200 taken along the line a-a of FIG. 5A.

Trenches 210 are filled with a dielectric material 218. The dielectric material 218 may include silicon oxide, and hence is also referred to as oxide 218 in the present disclosure. In some embodiments, other dielectric materials, such as silicon nitride, silicon oxynitride, fluoride-doped silicate glass (FSG), or a low-K dielectric material, may also be used. In an embodiment, the oxide 218 may be formed using a high-density-plasma (HDP) CVD process, using silane ($SiH_4$) and oxygen ($O_2$) as reacting precursors. In other embodiments, the oxide 218 may be formed using a sub-atmospheric CVD (SACVD) process or high aspect-ratio process (HARP), wherein process gases may comprise tetraethylorthosilicate (TEOS) and/or ozone ($O_3$). In yet other embodiments, the oxide 218 may be formed using a spin-on-dielectric (SOD) process, such as hydrogen silsesquioxane (HSQ) or methyl silsesquioxane (MSQ).

Figure 6B:
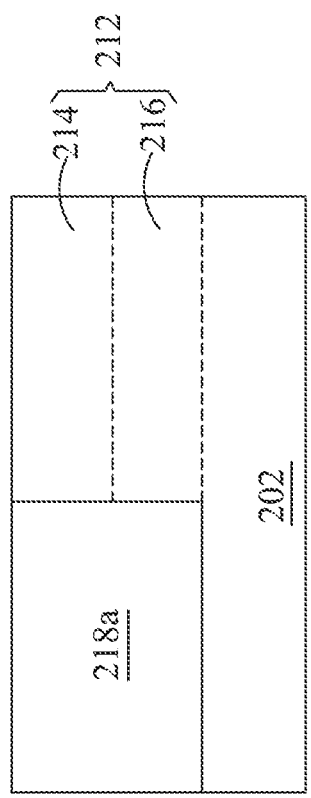
Figure 6A:
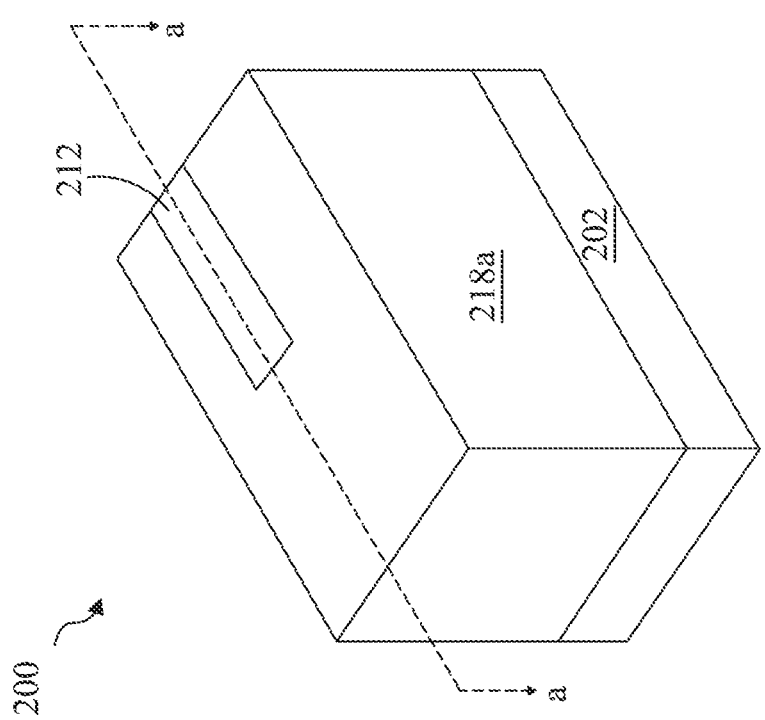

FIGS. 5A and 5B depict the resulting structure after the deposition of the dielectric material 218. A chemical mechanical polish is then performed, followed by the removal of the mask layer 204b and pad layer 204a. The resulting structure is shown in FIGS. 6A and 6B. FIG. 6A is a perspective view of the semiconductor device 200 at one of the various stages of fabrication according to an embodiment, and FIG. 6B is a cross-sectional view of the semiconductor device 200 taken along the line a-a of FIG. 6A.

The remaining portions of the oxide 218 in the trenches 210 are hereinafter referred to as insulation regions 218a. In double-gate embodiments, the mask layer 204b and pad layer 204a may remain on the top of the fin 212 (not shown). In triple-gate embodiments and embodiments in which the mask layer 204b is formed of silicon nitride, the mask layer 204b may be removed using a wet process using hot $H_3PO_4$, while the pad layer 204a may be removed using diluted HF acid, if formed of silicon oxide. In some alternative embodiments, the removal of the mask layer 204b and pad layer 204a may be performed after the recessing of the insulation regions 218a, which recessing step is shown in FIGS. 7A and 7B.

In an alternative embodiment, the upper portion 214 of the fin 212 is replaced by another semiconductor material to enhance device performance. Using insulation regions 218a as a hard mask, the upper portion 214 of the fin 212 is recessed by an etching step. Then a different material such as Ge is epi-grown to fill the recessed portion. In the depicted embodiment, the upper portion 214 of the fin 212 such as Ge and lower portion 216 of the fin 212 such as Si comprise different materials.

Figures 7A, 7B:
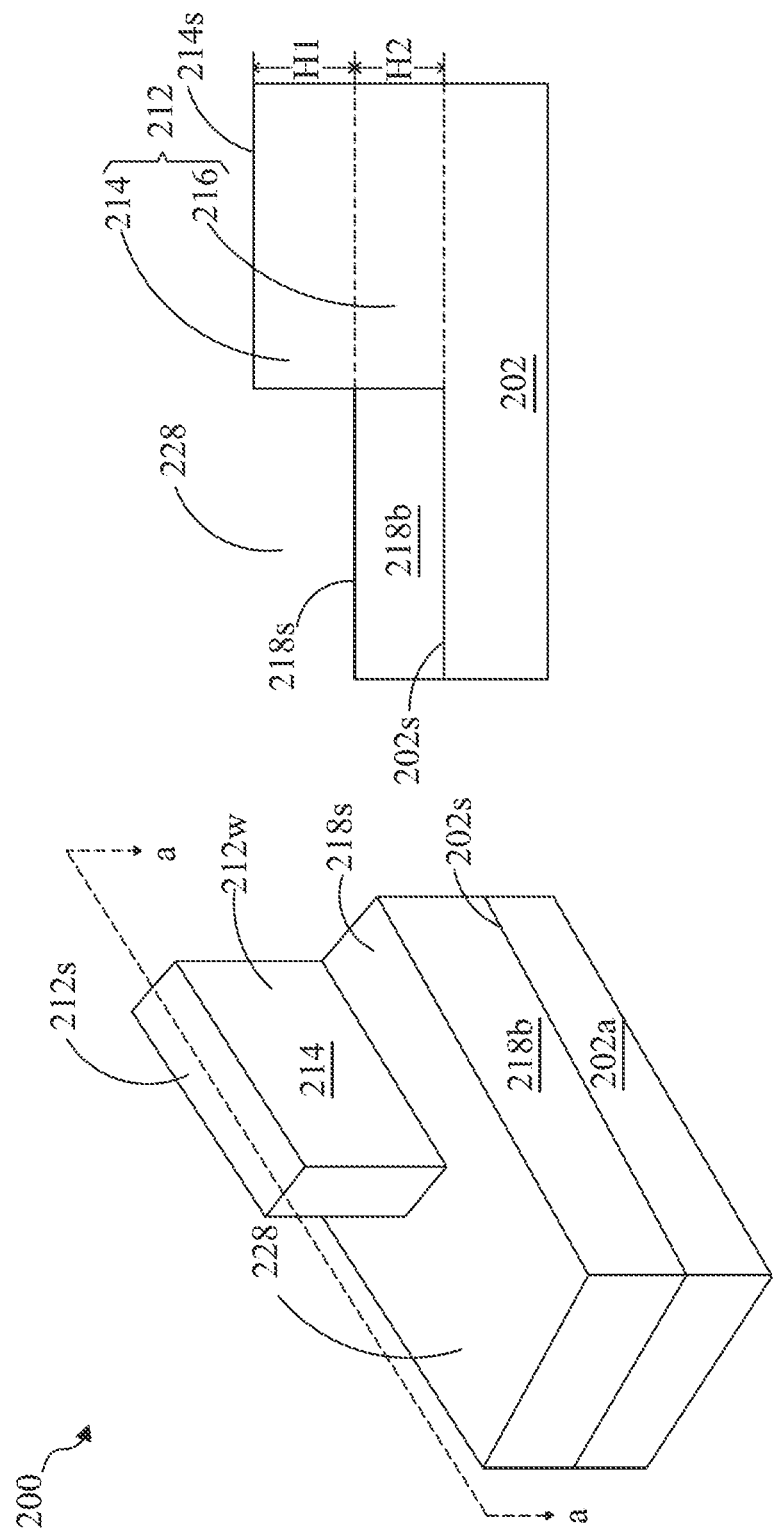

As depicted in FIGS. 7A and 7B, and step 106 in FIG. 1, after the removal of the mask layer 204b and pad layer 204a, the insulation regions 218a are recessed by an etching step, forming a fin (i.e., the upper portion 214 of the fin 212) through an opening 228 in the insulation region 218b, wherein the upper portion 214 of the fin 212 has two sidewalls 212w and a third surface 212s. FIG. 7A is a perspective view of the semiconductor device 200 at one of the various stages of fabrication according to an embodiment, and FIG. 7B is a cross-sectional view of the semiconductor device 200 taken along the line a-a of FIG. 7A.

In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

The remaining insulation regions 218b may be strips (viewed from in the top of the semiconductor 200) parallel to each other, and closely spaced with respect to each other. In an alternative embodiment, the remaining insulation regions 218b may be continuous and surrounding the lower portion 216 of the semiconductor fin 212. Further, the remaining insulation regions 218b cover a portion of the first surface 202s, wherein a top of the remaining insulation region 218b defines a second surface 218s.

In the depicted embodiment, the upper portion 214 of the fin 212 has a first height $H_1$ above the second surface 218s. In some embodiments, the first height $H_1$ is in the range of about 20 to 50 nm. The upper portion 214 of the fin 222 has the two sidewalls 214w and third surface 214s. The upper portion 214 thus is used to form a channel region of the semiconductor device 200. In some embodiments, the semiconductor fin 212 further comprises a lower portion 216 extending downward from the second surface 218s to the first surface 202s has a second height $H_2$. In some embodiments, a ratio of the first height $H_1$ to the second height $H_2$ is from about 0.2 to 0.5. Having more rigid volume than the upper portion 214, the lower portion 216 can avoid fin 212 deformation of the semiconductor device 200 due to high stress of the insulation regions 218b.

A dummy gate stack 226 is then formed over the second surface 218s of the insulation region 218b, while a gate stack 236 is formed over the upper portion 214 and extending to the second surface 218s of the insulation region 218b. In some embodiments, each of the dummy gate stack 226 and the gate stack 236 (see FIGS. 10A and 10B) comprises a gate dielectric 222 and a gate electrode layer 224 over the gate dielectric layer 222.

For fabricating gate stacks (such as the dummy gate stack 226 and the gate stack 236 shown in FIGS. 10A, 10B, 10C, and 10D), the structure in FIGS. 8A and 8B are produced by forming a gate dielectric 222 to cover the two sidewalls 214w and the third surface 214s of the upper portion 214 and extending across the second surface 218s of the insulation region 218b. FIG. 8A is a perspective view of the semiconductor device 200 at one of the various stages of fabrication according to an embodiment, and FIG. 8B is a cross-sectional view of the semiconductor device 200 taken along the line a-a of FIG. 8A.

In some embodiments, the gate dielectric 222 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In the depicted embodiment, the gate dielectric 222 is a high-k dielectric layer with a thickness in the range of about 10 angstroms to 30 angstroms. The gate dielectric 222 may be formed using a suitable process such as atomic layer deposition (ALD), chemical vapor deposition (CVD), physical vapor deposition (PVD), thermal oxidation, UV-ozone oxidation, or combinations thereof. The gate dielectric 222 may further comprise an interfacial layer (not shown) to reduce damage between the gate dielectric 222 and upper portion 214 of the fin 212 (i.e., channel region of the semiconductor device 200). The interfacial layer may comprise silicon oxide.

Then, as depicted in FIGS. 8A and 8B, and step 108 in FIG. 1, a gate electrode layer 224 is formed over the gate dielectric 222. In the depicted embodiment, the gate electrode layer 224 covering the upper portion 214 of the semiconductor fin 212 is used to form a separate FinFET. In an alternative embodiment, the gate electrode layer 224 covers the upper portion 214 of more than one semiconductor fin 212 (not shown), so that the resulting FinFET comprises more than one fin.

In some embodiments, the gate electrode layer 224 may comprise a single-layer or multilayer structure. In at least one embodiment, the gate electrode layer 224 comprises poly-silicon. Further, the gate electrode layer 224 may be doped poly-silicon with uniform or nonuniform doping. In some embodiments, the gate electrode layer 224 comprises an N-work-function metal. The N-work-function metal comprises a metal selected from a group of W, Cu, Ti, Ag, Al, TiAl, TiAlN, TaC, TaCN, TaSiN, Mn, and Zr. In some embodiments, the gate electrode layer 224 comprises a P-work-function metal. The P-work-function metal comprises a metal selected from a group of TiN, WN, TaN, and Ru. In the depicted embodiment, the gate electrode layer 224 comprises a thickness in the range of about 30 nm to about 60 nm. The gate electrode layer 224 may be formed using a suitable process such as ALD, CVD, PVD, plating, or combinations thereof.

A patterned mask 232, such as a layer of patterned photoresist material, is formed over the gate electrode layer 224 by a suitable process, such as spin-on coating. In another example, a hard mask layer (not shown) is formed over the gate electrode layer 224; a patterned photoresist layer is formed on the hard mask layer; and the pattern of the photoresist layer is then transferred to the hard mask layer to form a patterned mask layer 232 over the gate electrode layer 224. The hard mask layer may comprise silicon oxide. In some alternative embodiments, the hard mask layer may optionally comprise silicon nitride, and/or silicon oxynitride, and may be formed using a method such as CVD or PVD. The hard mask layer comprises a thickness in the range from about 100 to 800 angstroms. In at least one embodiment, the patterned mask layer 232 comprises a first feature 232a over the second surface 218s (not over the third surface 214s) and a second feature 232b over the third surface 214s.

The process steps up to this point have provided the substrate 202 having the patterned mask layer 232 comprising the first feature 232a over the second surface 218s and the second feature 232b over the third surface 214s. Conventionally, the first and second features 232a, 232b can then be transferred using an etching process to the underlying layers (i.e., the gate dielectric 222 and gate electrode layer 224) to form a dummy gate stack over the second surface 218s and a gate stack covers the two sidewalls 214w and third surface 214s. A patterned gate electrode layer over the second surface 218s is referred to a dummy gate electrode, while a patterned gate electrode layer covering the two sidewalls 214w and third surface 214s is referred to a gate electrode. The gate electrode thus wraps the channel portion of the exposed upper portion 214 of the fin 212.

However, if using a fixed etching process, a configuration of the dummy gate electrode is changed from a base to a bottom broader than the base as the upper portion 214 of the fin 212 is exposed. This may generate unwanted residues between fin 212 edge and the dummy gate electrode, thereby increasing the likelihood of device instability and/or device failure.

Accordingly, the processing discussed below with reference to FIGS. 9A, 9B, 10A, 10B, 10C, and 10D may etch the gate electrode layer 224 to form a dummy gate electrode comprising a bottom and a base broader than the bottom. This can avoid unwanted residues between fin edge and the dummy gate electrode and thus upgrading device performance.

As depicted in FIGS. 9A and 9B, and step 112 in FIG. 1, for fabricating gate stacks (such as the dummy gate stack 226 and the gate stack 236 shown in FIGS. 10A, 10B, 10C, and 10D), the structures in FIGS. 9A and 9B are produced by forming a base 230a of the gate electrode 230 and a base 220a of the dummy gate electrode 220 performed by a first etching process 240. FIG. 9A is a perspective view of the semiconductor device 200 at one of the various stages of fabrication according to an embodiment, and FIG. 9B is a cross-sectional view of the semiconductor device 200 taken along the line a-a of FIG. 9A.

Referring to FIGS. 9A and 9B, the first feature 232a and the second feature 232b can then be transferred using the first etching process 240 to the gate electrode layer 224 to form the base 230a of the gate electrode 230 and the base 220a of the dummy gate electrode 220. In some embodiments, the step of the first etching process is performed under a source power of about 100 to 1000 W and a pressure of about 1 mTorr to 40 mTorr, at a temperature between about 10° C. to 50° C., using $SF_6$ as an etching gas. In some embodiments, the etching gas may further comprise $Cl_2$, $N_2$, $CF_4$, $CHF_3$, $CH_2F_2$, $N_2H_2$, $O_2$, or He.

Figures 10A, 10B:
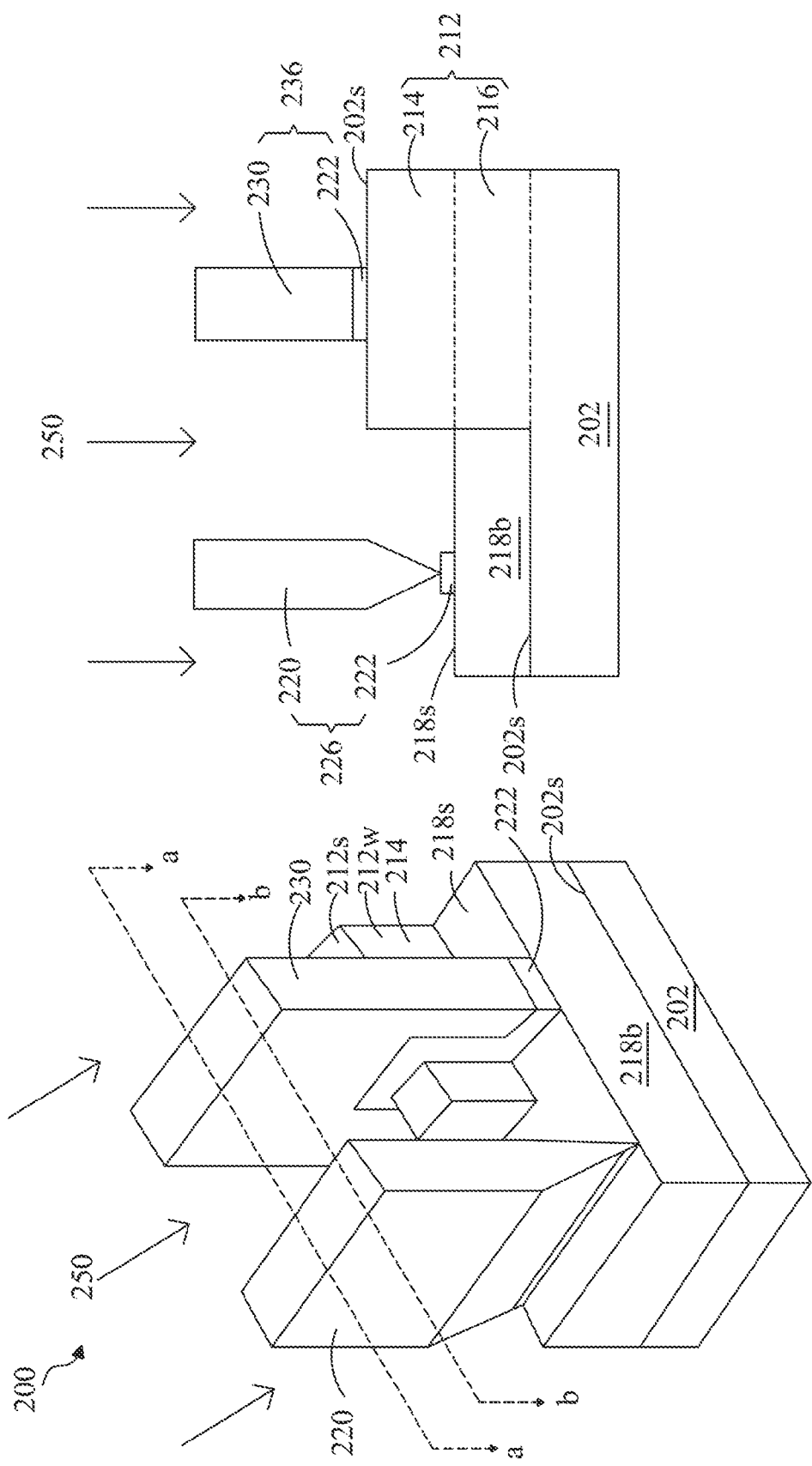
Figures 10C, 10D:
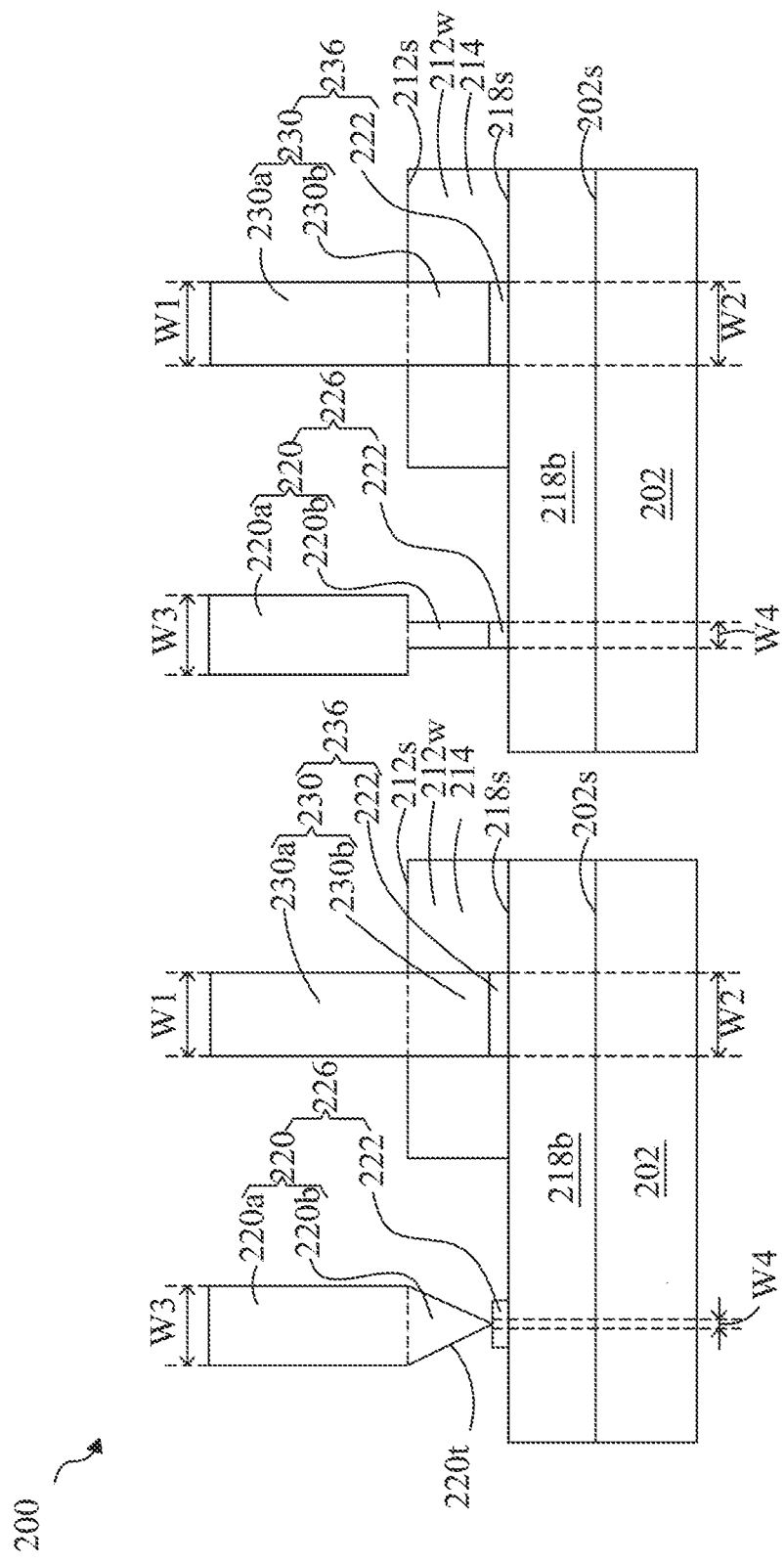
FIG. 10C shows a cross-sectional view of a semiconductor device comprising a dummy gate electrode according to various aspects of the present disclosure.
FIG. 10D shows a cross-sectional view of a semiconductor device comprising a dummy gate electrode according to various aspects of the present disclosure.

As depicted in FIGS. 10A, 10B, 10C, and 10D, and step 112 in FIG. 1, for fabricating gate stacks (such as the dummy gate stack 226 and the gate stack 236), the structures in FIGS. 10A, 10B, 10C, and 10D are produced by forming a bottom 230b of the gate electrode 230 and a bottom 220b of the dummy gate electrode 220 performed by a second etching process 250. FIG. 10A is a perspective view of the semiconductor device 200 at one of the various stages of fabrication according to an embodiment, FIG. 10B is a cross-sectional view of the semiconductor device 200 taken along the line a-a of FIG. 10A, and FIG. 10C is a cross-sectional view of the semiconductor device 200 taken along the line b-b of FIG. 10A. In an alternative embodiment, FIG. 10D is a cross-sectional view of the semiconductor device 200 taken along the line b-b of FIG. 10A.

Referring to FIGS. 10A, 10B, 10C, and 10D, using the base 230a of the gate electrode 230 and the base 220a of the dummy gate electrode 220 as hard masks, the second etching process 250 to remaining the remaining gate electrode layer 224 is performed to form the bottom 230b of the gate electrode 230 and the bottom 220b of the dummy gate electrode 220. In some embodiments, the step of the second etching process 250 is performed under a source power of about 100 to 1000 W and a pressure of about 1 to 10 mTorr, at a temperature between about 10° C. to 50° C., using $BCl_3$ as an etching gas. In some embodiments, the etching gas may further comprise $Cl_2$, $N_2$, $CF_4$, $CHF_3$, $CH_2F_2$, $N_2H_2$, or $O_2$. The patterned mask layer 232 may be stripped thereafter.

As depicted in FIGS. 10C and 10D, the semiconductor device 200 comprises the substrate 202 comprising the first surface 202s; the insulation region 218b covering a portion of the first surface 202s, wherein the top of the insulation region 218b defines the second surface 218s; the fin 212 through an opening in the insulation region 218b, wherein the upper portion 214 of the fin 212 has the two sidewalls 212w and the third surface 212s; a gate electrode 230 covering the two sidewalls 212w and the third surface 212s, wherein the gate electrode 230 comprises the first base 230a and a first bottom 230b, wherein a difference between a width $W_1$ of the first base 230a and a width $W_2$ of the first bottom 230b defines a first width difference; and a dummy gate electrode 220 over the second surface 218s, wherein the dummy gate electrode 220 comprises a second bottom 220b and a second base 220a broader than the second bottom 220b, wherein a difference between a width $W_3$ of the second base 220a and a width $W_4$ of the second bottom 220b defines a second width difference, wherein the second width difference is greater than the first width difference.

In some embodiments, a ratio of the width $W_2$ of the first bottom 230b to the width $W_1$ of the first base 230a is from 0.95 to 1.05. In some embodiments, a ratio of the width $W_4$ of the second bottom 220b to the width $W_3$ of the second base 220a is from 0.5 to 0.9. In some embodiments, a ratio of the second width difference to the first width difference is from 2 to 100. In some embodiments, the second bottom 220b comprises a tapered sidewall 220t (shown in FIG. 10C). In some embodiments, the second bottom 220b is substantially perpendicular to the second surface 218s (shown in FIG. 10D).

In the depicted embodiment, both the gate electrode 230 and the dummy gate electrode 220 are fabricated using a gate-first process. The gate electrode 230 and the dummy gate electrode 220 thus comprise same material. In an alternative embodiment, if one of the gate electrode 230 and the dummy gate electrode 230 is fabricated using a gate-first process and the other is fabricated using a gate-last process, The gate electrode 230 and the dummy gate electrode 220 may thus comprise different material. In some embodiments, the gate electrode 230 and gate dielectric 222 are combined and referred to as the gate stack 236. In some embodiments, the dummy gate electrode 220 and gate dielectric 222 are combined and referred to as the gate stack 226.

It is understood that the semiconductor device 200 may undergo further CMOS processes to form various features such as source/drain regions, contacts/vias, interconnect metal layers, dielectric layers, passivation layers, etc. It has been observed that the dummy gate electrode comprises a bottom and a base broader than the bottom. Thus, in this manner unwanted residues between fin edge and the dummy gate electrode may be reduced and/or avoided, and thus upgrading device performance.

In accordance with embodiments, a semiconductor device comprises a substrate comprising a first surface; an insulation region covering a portion of the first surface, wherein the top of the insulation region defines a second surface; and a dummy gate electrode over the second surface, wherein the dummy gate electrode comprises a bottom and a base broader than the bottom, wherein a ratio of a width of the bottom to a width of the base is from about 0.5 to about 0.9.

In accordance with other embodiments, a semiconductor device comprises a substrate comprising a first surface; an insulation region covering a portion of the first surface, wherein the top of the insulation region defines a second surface; a fin through an opening in the insulation region, wherein an upper portion of the fin has two sidewalls and a third surface; a gate electrode covering the two sidewalls and the third surface, wherein the gate electrode comprises a first base and a first bottom, wherein a difference between a width of the first base and a width of the first bottom defines a first width difference; and a dummy gate electrode over the second surface, wherein the dummy gate electrode comprises a second bottom and a second base broader than the second bottom, wherein a difference between a width of the second base and a width of the second bottom defines a second width difference, wherein the second width difference is greater than the first width difference.

In accordance with yet other embodiments, a method of fabricating a semiconductor device comprises providing a substrate comprising a first surface; forming an insulation region covering a portion of the first surface, wherein the top of the insulation region defines a second surface; forming a fin through an opening in the insulation region, wherein an upper portion of the fin has two sidewalls and a third surface; forming a gate electrode layer over the fin and extending over the insulation region; forming a patterned mask layer over the gate electrode layer; and forming a gate electrode and a dummy gate electrode performed by a first etching process and a second etching process, wherein the gate electrode covers the two sidewalls and the third surface and the dummy gate electrode is over the second surface.

In an embodiment, a method of fabricating a semiconductor device is provided. The method comprises providing a substrate having an insulation region over the substrate and a fin extending through an opening in the insulation region. A gate electrode layer is formed over the fin and the fin extends over the insulation region. The gate electrode layer is patterned to form a gate electrode and a dummy gate electrode using a first etching process and a second etching process, wherein the gate electrode extends over an upper portion of the fin, and wherein the dummy gate electrode is over the insulation region, the dummy gate electrode being isolated from other circuitry.

In another embodiment, a method of fabricating a semiconductor device is provided. The method comprises providing a substrate having an insulation region over the substrate and a fin extending through an opening in the insulation region. A gate electrode is formed extending over an upper portion of the fin, and a dummy gate electrode is formed over the insulation region. The dummy gate electrode does not extend over a conductive region, and a topmost surface of the dummy gate electrode and a topmost surface of the gate electrode are coplanar.

In yet another embodiment, a method of fabricating a semiconductor device is provided. The method comprises providing a substrate having an insulation region over the substrate and a fin extending through an opening in the insulation region. A gate electrode layer is formed over the fin and the gate electrode extends over the insulation region. A gate electrode is formed from the gate electrode layer, such that the gate electrode extends over an upper portion of the fin. The gate electrode has a first base and a first bottom interposed between the first base and the substrate. A dummy gate electrode is formed from the gate electrode layer, the dummy gate electrode extending over the insulation region, the dummy gate electrode being isolated from other circuitry, the dummy gate electrode having a second bottom and a second base wider than the second bottom, the second bottom being narrower than first bottom.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, the method comprising:
   providing a substrate having an insulation region over the substrate and a fin extending through an opening in the insulation region;
   forming a gate electrode layer over the fin and extending over the insulation region; and
   patterning the gate electrode layer to form a gate electrode and a dummy gate electrode using a first etching process and a second etching process, wherein the gate electrode extends over an upper portion of the fin, and wherein the dummy gate electrode is over the insulation region, the dummy gate electrode being isolated from other circuitry.

2. The method of claim 1, wherein a width of a bottom of the dummy gate electrode is less than a width of a bottom of the gate electrode.

3. The method of claim 1, wherein sidewalls of a bottom of the dummy gate electrode are tapered.

4. The method of claim 1, wherein the first etching process is performed at least in part by using $SF_6$ as an etching gas.

5. The method of claim 1, wherein the first etching process is performed under a pressure of about 1 mTorr to about 40 mTorr.

6. The method of claim 1, wherein the second etching process is performed using $BCl_3$ as an etching gas.

7. The method of claim 1, wherein the second etching process is performed under a pressure of about 1 mTorr to about 10 mTorr.

8. The method of claim 1, wherein the second etching process is performed under a source power of about 100 W to about 1000 W.

9. A method of fabricating a semiconductor device, the method comprising:
   providing a substrate having an insulation region over the substrate and a fin extending through an opening in the insulation region;
   forming a gate electrode extending over an upper portion of the fin; and
   forming a dummy gate electrode over the insulation region, the dummy gate electrode not extending over a conductive region, a topmost surface of the dummy gate electrode and a topmost surface of the gate electrode being coplanar, the dummy gate electrode being formed of a conductive material, wherein the dummy gate electrode includes a base portion and a bottom portion, the bottom portion of the dummy gate electrode being interposed between the base portion of the dummy gate electrode and the insulation region, sidewalls of the base portion of the dummy gate electrode having a sidewall slope different than a sidewall slope of sidewalls of the bottom portion of the dummy gate electrode.

10. The method of claim 9, wherein a width of a bottom of the dummy gate electrode is less than a width of a bottom of the gate electrode.

11. The method of claim 9, wherein sidewalls of a bottom of the dummy gate electrode are tapered.

12. The method of claim 9, wherein the gate electrode includes a base portion and a bottom portion, the bottom portion of the gate electrode being interposed between the base portion of the gate electrode and the insulation region, a sidewall slope of the bottom portion of the gate electrode being different than the sidewall slope of the bottom portion of the dummy gate electrode.

13. The method of claim 9, wherein the forming the dummy gate electrode comprises forming the base portion of the dummy gate electrode using a first etch process and forming the bottom portion of the dummy gate electrode using a second etch process, the first etch process being different than the second etch process.

14. The method of claim 13, wherein the first etch process is performed at least in part by using $SF_6$ as an etching gas.

15. The method of claim 13, wherein the second etch process is performed using $BCl_3$ as an etching gas.

16. A method of fabricating a semiconductor device comprising:

providing a substrate having an insulation region over the substrate and a fin extending through an opening in the insulation region;

forming a gate electrode layer over the fin and extending over the insulation region;

forming a gate electrode from the gate electrode layer, the gate electrode extending over an upper portion of the fin, the gate electrode having a first base and a first bottom interposed between the first base and the substrate; and forming a dummy gate electrode from the gate electrode layer, the dummy gate electrode extending over the insulation region, the dummy gate electrode being isolated from other circuitry, the dummy gate electrode having a second base and a second bottom interposed between the second base and the substrate, the second base being wider than the second bottom, the second bottom being narrower than the first bottom.

17. The method of claim 16, wherein sidewalls of the second bottom of the dummy gate electrode are tapered.

18. The method of claim 16, wherein the forming the dummy gate electrode comprises a first etching process to form the second base and a second etching process to form the second bottom, the first etching process being different than the second etching process.

19. The method of claim 16, wherein a slope of a sidewall of the first bottom is different than a slope of a sidewall of the second bottom.

20. The method of claim 9, wherein the gate electrode and the dummy gate electrode comprise different materials.

* * * * *